(12) United States Patent
Hayashi et al.

(10) Patent No.: US 6,410,145 B1
(45) Date of Patent: Jun. 25, 2002

(54) THERMOSETTING RESIN COMPOSITION FOR BUILD-UP

(75) Inventors: Toshiaki Hayashi, Tsukuba; Nobuyuki Nakajima, Niihama; Noriaki Saito, Toyonaka, all of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/604,528

(22) Filed: Jun. 27, 2000

(30) Foreign Application Priority Data

Jul. 2, 1999 (JP) .......................... 11-188978

(51) Int. Cl.⁷ .............................. B32B 15/08
(52) U.S. Cl. .................. 428/418; 523/453; 525/523
(58) Field of Search .................. 428/418; 523/453; 525/523

(56) References Cited

U.S. PATENT DOCUMENTS

| | | |
|---|---|---|
| 4,855,339 A | 8/1989 | Saito et al. |
| 5,519,177 A | 5/1996 | Wang et al. |

FOREIGN PATENT DOCUMENTS

| | | |
|---|---|---|
| EP | 0 612 812 A2 | 8/1994 |
| JP | 08 059842 * | 3/1996 |
| JP | 11-35916 | 2/1999 |
| JP | 11-100562 | 4/1999 |

* cited by examiner

Primary Examiner—Robert Dawson
Assistant Examiner—D. Aylward
(74) Attorney, Agent, or Firm—Sughrue Mion, PLLC

(57) ABSTRACT

Provided are a thermosetting resin composition for build-up method which gives a cured product excellent in heat resistance, an insulating material for build-up method using thereof and a build-up print circuit board. The thermosetting resin composition for build-up method comprises (A) an epoxy resin represented by formula (I), (B) a curing agent for epoxy resin and (C) a poly(ether sulfone), an insulating material for build-up method and a build-up print circuit board using thereof.

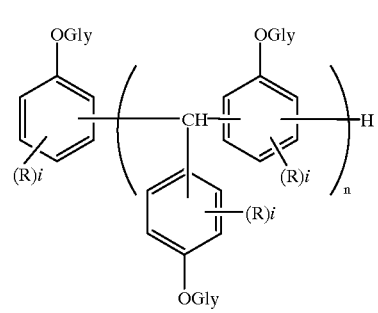

(1)

in the formula, Gly represents glycidyl group: R represents each independently, an alkyl group having 1 to 10 carbons, and the like; i represents each independently a numeral of 0 to 4; when i is 2 or more, R may be the same or different from each other; and n represents a repeating number of 1 to 10.

4 Claims, No Drawings

THERMOSETTING RESIN COMPOSITION FOR BUILD-UP

BACKGROUND OF THE INVENTION

1. Field of the Invention

The present invention relates to a thermosetting resin composition for build-up method. More precisely, it relates to a thermosetting resin composition for build-up method comprising an epoxy resin, a curing agent for epoxy resin and poly(ether sulfone). In addition, it relates to an insulating material for build-up method and a build-up print circuit board using said thermosetting resin composition.

2. Description of the Related Art

In recent years, a high-density mounting has been demanded as the progress of downsizing, light weighing and thin shaping of electronic apparatuses. By this reason, it has become required in print circuit board not only to minimize circuit patterns but also to reduce diameter of through holes and via holes, and to adopt blind via holes. Increasing attention has been given to build-up print circuit boards obtainable by the build-up method as a product meeting with these requirements. Practical insulating materials for build-up circuit board include a photo-sensitive resin type having merit that a number of via holes, can be formed in one operation by exposure-development step and a thermosetting resin type which allows formation of finer via holes, by using the laser process. In case of photo-sensitive resin type insulating material, there Is a limitation in selection of the photo-sensitive resin which gives a photosensitivity to the resin composition thereof, and there are many know-hows in the exposure-development step. Thus, at present, the thermosetting resin type insulating material is attracting more attention.

Proposed thermosetting resin compositions for use in the thermosetting resin type insulating materials include, in addition to a composition comprising a thermosetting resin alone such as an epoxy resin, a phenoxy resin or the like, a composition comprising a thermosetting resin and a thermoplastic resin. For example, JP-A-7-33991 and JP-A-7-34048 describe a thermosetting resin containing an epoxy resin and a poly(ether sulfone).

When the conventional thermosetting resin composition is used, however, it has been difficult to obtain an insulating material for build-up method which is satisfactory in heat resistance.

The object of the present invention is to provide a thermosetting resin composition for build-up method which gives a cured product excellent in heat resistance, to provide an insulating material for build-up method using said thermosetting resin composition and to provide a build-up print circuit board using said insulating material.

SUMMARY OF THE INVENTION

As the result of extensive studies for solving above described problems, the inventors have found that the above object can be attained by using a composition comprising a specific epoxy resin, a curing agent for epoxy resin and a poly(ether sulfone), thus the present invention has been completed.

That is, the present invention relates to (I) a thermosetting resin composition for build-up method comprising (A) an epoxy resin represented by the formula (1) , (B) a curing agent for epoxy resin, and (C) a poly(ether sulfone),

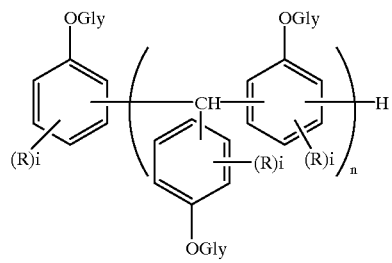

in the formula, Gly represents glycidyl group; R represents each independently, an alkyl group having 1 to 10 carbons, a cycloalkyl group having 5 to 7 carbons, or a hydrocarbon group having 6 to 20 carbon atoms which contains a cycloalkyl group having 5 to 7 carbons; in represents each independently a numeral of 0 to 4; when i is 2 or more, R may be the same or different from each other; and n represents a repeating number of 1 to 10.

In addition, the present invention relates to (II) an insulating material for build-up method having a resin-containing layer formed by curing the thermosetting resin composition described for above (I).

The present invention also relates to (III) a build-up print circuit board formed by using the insulating material described for above (II).

DETAILED DESCRIPTION OF THE INVENTION

The thermosetting resin composition of the present invention is a thermosetting resin composition for build-up method which contains(A) an epoxy resin represented by formula (I), (B) a curing agent for epoxy resin, and (C) a poly(ether sulfone).

In the present invention, the epoxy resins represented by the formula (1), can be used alone or in combination of two or more. In view of curing property, in the formula, it is preferable that R is methyl, ethyl, propyl (including isomers), butyl (including isomers). cyclopentyl or cyclohexyl; i is a numeral of 0 to 3, and n is a repeating number of 1 to 5. It is more preferable that R is methyl, ethyl, or t-butyl; i is a numeral of 0 to 2, and n is a repeating number of 1 to 3.

The amount of the component (A) can be suitably selected in conjunction with other components and usually 1% by weight or more, preferably 1 to 80% by weight, based on the total amount of (A), (B) and (C) of the composition.

Process for producing the component (A) can be adopted among known processes including, for example, a process in which a phenol compound or its derivative is reacted with an epihalohydrin in the presence of an alkali such as sodium hydroxide.

In the present invention, known compounds can be used as the curing agent for epoxy resin as the component (B). Examples include polyhydric phenol curing agents for epoxy resin such as phenol novolac, cresol novolac, phenol-modified polybutadiene and the like; amine curing agents for epoxy resin such as dicyandiamide, diaminodiphenyl methane, diaminodiphenyl sulfone and the like; acid-anhydride curing agents for epoxy resin such as pyromellitic acid anhydride, trimellitic acid anhydride, benzophenone tetracarboxylic acid dianhydride and the like; and so on. One or more of them can be used. Among them, polyhydric phenol curing agents for epoxy resin such as phenol novolac are preferred from the viewpoint of low water absorption of cured product.

The amount of the component (B) may usually be determined so that the cured product obtained from the thermosetting resin composition of the invention has a high glass transition temperature. For example, a phenol curing agent is used as the component (B), the ratio of the epoxy equivalent of the component (A) and the hydroxyl group equivalent of the component (B) is usually 1:0.8 to 1:1.2, and preferably 1:1. When an amine curing agent is used as the component (B), the ratio of the epoxy equivalent of the component (A) and the amine group equivalent of the component (B) is usually 1:0.6 to 1:1, and preferably 1:0.8. When an acid anhydride curing agent is used as the component (B), the ratio of the epoxy equivalent of the component (A) and the carboxyl group equivalent of the component (B) is usually 1:0.8 to 1:1.2, and preferably 1:1.

The sum of the components (A) and (B) is usually 5 to 90% by weight based on the total amount of the components (A) to (C) of the composition.

In the present invention, known compounds can be used as the poly(ether sulfone) as the component (C). A terminal group of the poly(ether sulfone) molecule includes, for example, a halogen atom, an alkoxy group, a phenolic hydroxyl group and the like. From the viewpoint of solvent resistance and toughness of cured products, a phenolic hydroxyl group is preferred. In this case, it is preferred that the both terminals are phenolic hydroxyl groups. In the poly(ether sulfone) molecule, structural units other than the terminal(s) are not particularly limited.

The amount of the component (C) is usually 10 to 70% by weight based on the total amount of the thermosetting resin composition, and preferably 10 to 50% by weight. When the amount is less than 10% by weight, the toughness of cured products may decrease When the amount exceeds 70% by weight, processability of the composition may lower or the water absorption of cured products may increase.

Known process can be adopted as the processes for producing the component (C). In addition, Examples of commercially available products include Sumika Excel (trademark), manufactured by Sumitomo Chemical Co., Ltd. and REDEL (trademark), manufactured by Amoco Chemicals Corp.

The thermosetting resin composition of the invention may contain (D) a curing catalyst, for the purpose of promoting cure reaction. Known compounds can be used as the component (D). Examples include organic phosphine compounds and triphenyl borane complex thereof such as triphenylphosphine, tri-4-methylphenylphosphine, tri-4-methoxyphenylphosphine, tributylphosphine, trioctylphosphine, tri-2-cyanoethylphosphine and the like; quaternary phosphonium salts such as tetraphenylphosphonium tetrafluoroborate, tetrabutylphosphonium tetraphenylborate and the like; tertiary amines such as tributylamine, triethylamine, 1,8-diazabicyclo[5,4,0]undecene-7, triamylamine and the like; quaternary ammonium salts such as benzyl trimethyl ammonium chloride, benzyl trimethyl ammonium hydroxide, triethyl ammonium tetraphenylborate and the like; imidazole compounds such as 2-ethylimidazole, 2-ethyl-4-methylimidazole and the like; and so on. One or more of them can be used. Among them, organic phosphine compounds and imidazole compounds are preferred.

The amount of the component (D) can be suitably selected so that the gel time of the thermosetting resin composition of the invention is the desired value. Usually, preferred gel time of the thermosetting resin composition is 1 to 15 minutes at a temperature within a range of 80° C. to 250° C.

In addition, the thermosetting resin composition of the invention may contain, if necessary, a thermosetting resin other than the component (A). Examples include epoxy resins other than the component (A), cyanate resins, addition polymerization products of bismaleimids and diamines, alkenyl aryl ethers such as bisvinyl benzyl ether compounds of bisphenol A and the like, alkenylamine resins such as vinylbenzyl compounds of diaminodiphenylmethane and the like, alkynyl ethers such as dipropargyl ether of bisphenol A and the like, alkynylamine resins such as propargyl compounds of diaminodiphenylmethane and the like, phenol resins, resol resins, allylether compounds, allylamine compounds, isocyanates, triallylisocyanurates, triallylcyanurates, vinyl group-containing polyolefine compounds and so on.

As the epoxy resins except the component (A), exemplified are, for example, di-functional epoxy resins derived from dihydric phenols such as bisphenol A, bisphenol F, tetrabromobisphenol A, bisphenol S, dihydroxybiphenyl, dihydroxynaphthalene, dihydroxystilbene, alkyl-substituted hydroquinone and the like; novolac type epoxy resin derived from novolacs such as phenol novolac, cresol novolac, naphtol novolac, bisphenol A novolac and the like; polyfunctional epoxy resins derived from polycondensation products of phenol compounds such as phenol, alkyl-substituted phenol, naphthol and the like with divalent aldehydes such as terephthalaldehyde, alkyl-substituted terephthalaldehyde and the like; epoxy resins derived from polyaddition products of phenol compounds with cyclopentadiene; and so on.

Further, the thermosetting resin composition of the invention may contain, if necessary, a thermoplastic resin other than the component (C). Examples include polysulfones, polyetherimides, polyphenylene ethers, polystyrene, polyethylene, polybutadiene, polyimides, polycarbonates, polyacrylates, polymethacrylates, terminal amine- and terminal carboxyl-modified polybutadiene-acrylonitrile rubbers, modified compounds thereof and the like.

Still, the thermosetting resin composition of the invention may be conferred with photosetting property, if necessary. For example, acrylates, methacrylates, styrene compounds or the like can be contained.

Still further, the thermosetting resin composition of the invention may contain, if necessary, known additives including organic flame retarder such as bromo-containing polycarbonates, bromo-containing polyphenylene oxides, bromo-containing polyacrylates, bromo-containing polystyrenes and the like; inorganic flame retarder such as antimony trioxide, aluminum hydroxide, phosphorus red and the like; mold release agent such as waxes, zinc stearate and the like; surface treatment agent such as silane coupling agent and the like; organic filler such as powdery epoxy resins, powdery melamine resins, powdery urea resins, powdery guanamine resins, powdery polyester resins and the like; inorganic filler such as silica, alumina, titanium oxide, and the like; and so on.

The thermosetting resin composition of the invention is suitably used as a raw material for a resin-containing layer of insulating material in the build-up method, because the cured product obtainable therefrom is excellent in heat resistance. In addition, other applications of the thermosetting resin composition of the invention may include insulating materials for use in a method other than the build-up method, composite materials, adhesive materials, painting materials and the like.

In the present invention, the insulating material for build-up method refers to a material having a resin-containing layer produced by curing the thermosetting resin composition of the invention in the form of a sheet or a film. The resin-containing layer may be piled. The thickness of one resin-containing layer is usually within a range of 10 to 300μm.

Processes for producing the insulating material include, for example, processes (i) and (ii) described below:

(i) Components for use in the thermosetting resin composition of the invention are mixed with a solvent such as γ-butyrolactone, dimethylformamide (DMF), N-methylpyrrolidone (NMP) or the like, if necessary. The mixture is directly applied on a core board with a roll coater or a table coater. After evaporating the solvent, the mixture is cured by heating to form an insulating layer. Then a circuit is formed by laser process or plating process and this procedure is repeated to form a build-up layer (insulating layer).

(ii) Components for use in the thermosetting resin composition of the invention are mixed with a solvent such as γ-butyrolactone, dimethylformamide (DMF), N-methylpyrrolidone (NMP) or the like, if necessary. The mixture is applied on a copper leaf using a table coater or the like to form a thin film. Then the film is treated by heat while evaporating the solvent to form a semi-cured resin-copper leaf. The same leaves are piled one by one onto a core board and cured by heating to form a circuit. This procedure is repeated to form a build-up layer (insulating layer).

In the process (i), conditions for evaporating the solvent are suitably selected according to the components used in the thermosetting resin composition and kind and amount of the solvent. Usually, the conditions include a temperature within a range of 60° C. to 200° C. for 1 to 30 minutes. The curing method by heating includes, for example, a method conducted under conditions including a temperature within a range of 60° C. to 200° C. for 30 minutes to 5 hours in a hot gas oven.

On the other hand, in the process (ii), conditions for heating to perform semi-curing are suitably selected according to the components used in the thermosetting resin composition and kind and amount of the solvent. Usually, the conditions include a temperature within a range of 60° C. to 200° C. for 1 to 30 minutes. The curing method by heating of the resin-copper leaf includes, for example, a method of heat-pressing conducted under conditions including a temperature within a range of 80° C. to 250° C. for 20 to 300 minutes under a molding pressure of 10 kg/cm$^2$ to 100 kg/cm$^2$.

The insulating material of the invention is suitably used as a raw material for a build-up print circuit board, because it is excellent in heat resistance. The process for producing the build-up print circuit board may be a known process. In addition, the insulating material of the invention can be used as a raw material for print circuit board other than the build-up print circuit board.

EXAMPLES

The present invention will now be described by reference of Examples, which should not be construed as a limitation upon the scope of the present invention.

EXAMPLES 1, 2, 3 AND 4; COMPARATIVE EXAMPLES 1 AND 2

Components and solvents listed in Table 1 were mixed in a ratios (in parts by weight) described in Table 1. The obtained mixtures were spread all over Teflon sheets to a thickness of about 200 μm. These were dried at 100° C. for 10 minutes under vacuum to form semi-cured products. The semi-cured products were heat-pressed at a pressure of 50 kg/cm$^2$ and under conditions described in Table 1 to give cured products. The obtained cured products were assayed for glass transition temperature (Tg) by using a thermoanalysis apparatus TMA 120 manufactured by Seiko Electronic Ind. The results are shown in Table 1.

TABLE 1

|  | Example 1 | Example 2 | Example 3 | Example 4 | Comparative Example 1 | Comparative Example 2 |
|---|---|---|---|---|---|---|
| Epoxy resin-1 | — | — | — | — | 70 | 45.5 |
| Epoxy resin-2 | 57 | 46.9 | 57 | 46.9 | — | — |
| Phenol novolac | 28 | 23.1 | 28 | 23.1 | — | 24.5 |
| PES5003P | — | — | 15 | 30 | — | — |
| PES4800P | 15 | 30 | — | — | 30 | 30 |
| 2E4MZ | 0.1 | 0.1 | 0.1 | 0.1 | 5 | 0.1 |
| DMF | 100 | 100 | 100 | 100 | 100 | 100 |
| Tg (TMA method) | 216 | 220 | 205 | 204 | 176 | 150 |
| Curing condition | 175° C. × 2 h | 175° C. × 2 h | 175° C. × 2 h | 175° C. × 2 h | 80° C. × 0.5 h 120° C. × 2 h 150° C. × 4 h | 175° C. × 2 h |

Epoxy resin-1: an epoxy resin derived from cresol novolac (manufactured by Sumitomo Chemical Co., Ltd.)
Epoxy resin-2: an epoxy resin derived from polycondensate of 2-t-butyl-5-methylphenol and 4-hydroxybenzaldehyde (prepared according to JP-B-7-121979, Referential Example 1). The repeating number n is about 1.5.
Phenol novolac: manufactured by Arakawa Chemical Industries, Ltd.
PES5003P: poly(ether sulfone) (trademark: Sumika Excel 5003P of terminal phenolic hydroxyl group type, manufactured by Sumitomo Chemical Co., Ltd.)
PES4800P: poly(ether sulfone) (trademark: Sumika Excel 4800P of terminal chlorine type, manufactured by Sumitomo Chemical Co., Ltd.)
2E4MZ: 2-ethyl-4-methylimidazol The thermosetting resin composition for build-up method according to the present invention gives a cured product excellent in heat resistance. Using said thermosetting resin composition, a useful insulating material for build-up method as well as a build-up print circuit board are provided.

What is claimed is:

1. An insulation layer having a thickness of 10 to 300 μm used for build-up method, wherein the layer is formed by curing a thermosetting resin composition comprising (A) an epoxy resin represented by formula (I), (B) a curing agent for epoxy resin, and (C) a poly(ether sulfone), (1)

[Chemical structure showing formula (I) with OGly groups, (R)i substituents, CH linkage, and subscript n]

in the formula, Gly represents glycidyl group; R represents each independently, an alkyl group having 1 to 10 carbons, a cycloalkyl group having 5 to 7 carbons, or a hydrocarbon group having 6 to 20 carbon atoms which contains a cycloalkyl group having 5 to 7 carbons; i represents each independently a numeral of 0 to 4; when i is 2 or more, R may be the same or different from each other; and n represents a repeating number of 1 to 10.

2. The insulation layer according to claim 1, which the thermosetting resin composition further comprises (D) a curing catalyst.

3. An insulating material for build-up method having the layer of claim 1 or 2.

4. A build-up print circuit board formed by using the insulating material of claim 3.

\* \* \* \* \*